(12) United States Patent
Park et al.

(10) Patent No.: US 8,803,148 B2
(45) Date of Patent: Aug. 12, 2014

(54) THIN FILM TRANSISTOR, MANUFACTURING METHOD OF THIN FILM TRANSISTOR, AND ORGANIC LIGHT EMITTING DIODE DISPLAY INCLUDING THE SAME

(75) Inventors: Byoung-Keon Park, Yongin (KR); Jong-Ryuk Park, Yongin (KR); Tak-Young Lee, Yongin (KR); Jin-Wook Seo, Yongin (KR); Ki-Yong Lee, Yongin (KR); Heung-Yeol Na, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/449,423

(22) Filed: Apr. 18, 2012

(65) Prior Publication Data
US 2012/0305921 A1    Dec. 6, 2012

(30) Foreign Application Priority Data
Jun. 3, 2011    (KR) .......................... 10-2011-0053957

(51) Int. Cl.
*H01L 31/00*    (2006.01)

(52) U.S. Cl.
USPC    257/59; 257/72; 257/E51.005; 257/E29.151; 438/181

(58) Field of Classification Search
CPC ...................... H01L 2227/323; H01L 27/3265; H01L 27/3276; H01L 51/56; H01L 27/3262; H01L 27/1214; H01L 27/1255; H01L 27/3244; H01L 27/3248; H01L 27/3246
USPC .............. 257/59, 72, E51.004; 438/151, 152, 438/153, 154, 155, 156, 157, 158, 159, 160, 438/161, 162, 163, 164, 165, 166
See application file for complete search history.

(56) References Cited

U.S. PATENT DOCUMENTS

| | | | |
|---|---|---|---|
| 5,545,571 A * | 8/1996 | Yamazaki et al. ............ | 438/151 |
| 7,608,869 B2 * | 10/2009 | Yang et al. ..................... | 257/288 |
| 7,687,328 B2 * | 3/2010 | Park et al. ..................... | 438/149 |
| 2005/0029591 A1 * | 2/2005 | Yudasaka et al. ............. | 257/347 |
| 2008/0157094 A1 * | 7/2008 | Seo et al. ........................ | 257/72 |
| 2008/0217620 A1 * | 9/2008 | Park et al. ..................... | 257/59 |
| 2008/0286912 A1 * | 11/2008 | Park et al. ..................... | 438/155 |

(Continued)

FOREIGN PATENT DOCUMENTS

| KR | 10-0627598 | 9/2006 |
|---|---|---|
| KR | 10-0742381 B1 | 7/2007 |
| KR | 10-0742382 B1 | 7/2007 |
| KR | 10-0875432 | 12/2008 |

*Primary Examiner* — Matthew W Such
*Assistant Examiner* — Samuel Lair
(74) *Attorney, Agent, or Firm* — Lee & Morse, P.C.

(57) ABSTRACT

A thin film transistor may include a substrate, a buffer layer on the substrate, a semiconductor layer formed on the buffer layer, a gate insulating pattern on the semiconductor layer, a gate electrode on the gate insulating pattern, an interlayer insulating layer covering the gate electrode and the gate insulating pattern, the interlayer insulating layer having a contact hole and an opening extending therethrough, the contact hole exposing a source area and a drain area of the semiconductor layer, and the opening exposing a channel area of the semiconductor layer, and a source electrode and a drain electrode formed on the interlayer insulating layer, the source electrode being connected with the source area and the drain electrode being connected with the drain area of the semiconductor layer.

27 Claims, 10 Drawing Sheets

(56) References Cited

U.S. PATENT DOCUMENTS

| | | | |
|---|---|---|---|
| 2008/0296565 A1* | 12/2008 | Park et al. | 257/40 |
| 2008/0308809 A1* | 12/2008 | Yang et al. | 257/66 |
| 2009/0001380 A1* | 1/2009 | Yang et al. | 257/72 |
| 2009/0050893 A1* | 2/2009 | Park | 257/72 |
| 2009/0050894 A1* | 2/2009 | Park et al. | 257/72 |
| 2009/0184632 A1* | 7/2009 | Kim et al. | 313/504 |
| 2009/0242895 A1* | 10/2009 | Park et al. | 257/72 |
| 2009/0256469 A1* | 10/2009 | Park et al. | 313/504 |
| 2010/0006855 A1* | 1/2010 | Park et al. | 257/72 |
| 2010/0155736 A1* | 6/2010 | Yoon et al. | 257/72 |
| 2010/0163855 A1* | 7/2010 | Lee et al. | 257/40 |
| 2010/0163885 A1* | 7/2010 | Park et al. | 257/72 |
| 2010/0224882 A1* | 9/2010 | Lee et al. | 257/72 |
| 2010/0224883 A1* | 9/2010 | Park et al. | 257/72 |
| 2010/0227443 A1* | 9/2010 | Lee et al. | 438/166 |
| 2010/0244036 A1* | 9/2010 | Park et al. | 257/72 |
| 2011/0014755 A1* | 1/2011 | Yang et al. | 438/158 |

* cited by examiner

THIN FILM TRANSISTOR, MANUFACTURING METHOD OF THIN FILM TRANSISTOR, AND ORGANIC LIGHT EMITTING DIODE DISPLAY INCLUDING THE SAME

RELATED APPLICATIONS

This application claims priority to and the benefit of Korean Patent Application No. 10-2011-0053957 filed in the Korean Intellectual Property Office on Jun. 3, 2011, the entire contents of which are incorporated herein by reference.

BACKGROUND

1. Field

The described technology relates generally to a thin film transistor, a manufacturing method of the thin film transistor, and an organic light emitting diode (OLED) display including the same.

2. Description of the Related Art

Generally, a polysilicon layer can be applied to a high electric field mobility and high-speed operation circuit and can be configured of a CMOS circuit. As such, a polysilicon layer has been mainly used as a semiconductor layer for a thin film transistor. The thin film transistor using the polysilicon layer may mainly be used for an active device for an active matrix liquid crystal display (AMLCD) and a switching device and a driving device of an organic light emitting diode (OLED).

A solid phase crystallization method and an excimer laser crystallization method are used as a method of crystallizing amorphous silicon into polysilicon. Solid phase crystallization is a method in which the amorphous silicon layer is annealed at the temperature of about 700° C. or less, which is the deformation temperature of the glass that forms the substrate of a display element. The display element uses the thin film transistor for several hours to several tens of hours. The excimer laser crystallization is a method in which the silicon layer is locally heated and crystallized at the high temperature for a very short time by injecting the excimer laser to the silicon layer. However, the solid phase crystallization method has a problem of long process time and is performed at a high temperature for a long period of time so that a substrate may be deformed, and the excimer laser crystallization method has a problem of using an expensive laser device and protrusions are formed at a crystallized surface so that an interface characteristic between the semiconductor layer and the gate insulating layer is deteriorated. Thus, a method for crystallizing an amorphous silicon layer using a metal catalyst has been actively studied because the method is more advantageous in crystallization at a lower temperature within a short period of time to the solid phase crystallization method. The crystallization method using a metal catalyst includes a metal induced crystallization (MIC) method, a metal induced lateral crystallization (MILC) method, and a super grain crystallization (SGS) method.

However, in a semiconductor layer crystallized using a metal catalyst, the catalyst remains in a channel area so that a leakage current may be increased. Thus, an additional gettering metal layer is formed on the semiconductor layer to prevent the leakage current, and a gettering process is performed to remove the metal catalyst in the semiconductor layer by moving the metal catalyst to the gettering metal layer through a getting heat treatment.

The additional process for removing the gettering metal layer increases manufacturing costs complicates the manufacturing process, thereby causing a process failure.

The above information disclosed in this Background section is only for enhancement of understanding of the background of the described technology and therefore it may contain information that does not form the prior art that is already known to a person of ordinary skill in the art.

SUMMARY

A thin film transistor may include a substrate, a buffer layer on the substrate, a semiconductor layer on the buffer layer, a gate insulating pattern on the semiconductor layer, a gate electrode on the gate insulating pattern, an interlayer insulating layer covering the gate electrode and the gate insulating pattern, the interlayer insulating layer having a contact hole and an opening extending therethrough, the contact hole exposing a source area and a drain area of the semiconductor layer and the opening exposing a channel area of the semiconductor layer; and a source electrode and a drain electrode formed on the interlayer insulating layer, the source electrode being connected with the source area and the drain electrode being connected with the drain area of the semiconductor layer.

An edge portion of the channel area of the semiconductor layer may include boundary edge portions adjacent to the source and drain areas and a connection edge portion connecting the boundary edge portions, and the opening may expose the gate insulating pattern on the connection edge portion of the channel area of the semiconductor layer.

The opening may further expose the buffer layer adjacent to the connection edge portion of the channel area of the semiconductor layer.

The opening may extend along the connection edge portion of the channel area.

A pattern of the gate insulating pattern may be the same as a pattern of the semiconductor layer.

The gate electrode may include a gate metal made of any one selected from Sc, Ti, Zr, Hf, V, Nb, Ta, Cr, Mo, W, Mn, Re, Ru, Os, Co, Rh, Ir, Pt, Y, Ta, La, Ce, Pr, Nd, Dy, Ho, Al, ITO, an alloy thereof, and a metal silicide.

The gate electrode may further include a gate metal electrode contacting the gate insulating pattern and a low-resistive metal electrode formed on the gate metal electrode.

A manufacturing method of a thin film transistor according to another exemplary embodiment may include: sequentially forming a buffer layer, a semiconductor layer, and a gate insulating pattern on a substrate; forming a gate metal layer covering the gate insulating pattern and the substrate; moving residual metal catalysts in the semiconductor layer to the gate metal layer that contacts the semiconductor layer by performing gettering heat treatment on the semiconductor layer; forming a gate electrode by patterning the gate metal layer; forming an interlayer insulating layer covering the gate electrode, the gate insulating pattern, and the substrate; forming a contact hole exposing a source area and a drain area of the semiconductor layer and an opening exposing a gate electrode on a channel area of the semiconductor layer by patterning the interlayer insulating layer and the gate insulating pattern; and forming a source electrode connected with the source area and a drain electrode connected with the drain area of the semiconductor layer on the interlayer insulating layer.

Forming of the source electrode and the drain electrode may include exposing a gate insulating pattern on a connection edge portion of the channel area of the semiconductor by etching an edge portion of the gate electrode exposed through the opening. The opening may expose the buffer layer adjacent to the connection edge portion of the channel area of the semiconductor layer.

The source area and the drain area in the semiconductor layer may be formed by doping the semiconductor layer using the gate electrode as a doping mask.

A pattern of the gate insulating pattern may be the same as a pattern of the semiconductor layer.

The gate metal layer may contact a side of the semiconductor layer

The gate electrode may be formed on a channel area of the semiconductor layer and may cover an edge portion of the gate insulating pattern.

Forming the semiconductor layer and the gate insulating pattern may include: sequentially forming an amorphous silicon layer and a metal catalyst layer on the buffer layer, forming a polysilicon layer by crystallizing the amorphous silicon layer, forming a gate insulating layer on the polysilicon layer, and simultaneously patterning the polysilicon layer and the gate insulating layer.

The forming the semiconductor layer and the gate insulating pattern may include forming a metal catalyst layer and an amorphous silicon layer on the buffer layer; forming a polysilicon layer by crystallizing the amorphous silicon layer, forming a gate insulating layer on the polysilicon layer; and simultaneously patterning the polyslilicon layer and the gate insulating layer.

The forming of the semiconductor layer and the gate insulating pattern may include sequentially forming a metal catalyst layer, an amorphous silicon layer, and a gate insulating layer on the buffer layer, forming a polysilicon layer by crystallizing the amorphous silicon layer, and simultaneously patterning the polysilicon layer and the gate insulating layer.

The gettering heat treatment may be performed at a temperature between 450° C. and 1043° C.

The manufacturing method of the thin film transistor may further include forming a low-resistive metal layer on the gate metal layer.

The gate electrode may be formed by patterning the gate metal layer and the low-resistive metal layer.

An organic light emitting diode (OLED) display according to another exemplary embodiment may includes a thin film transistor, the thin film transistor may include a substrate, a buffer layer on the substrate, a semiconductor layer on the buffer layer; a gate insulating pattern on the semiconductor layer; a gate electrode on the gate insulating pattern; an interlayer insulating layer covering the gate electrode and the gate insulating pattern, the interlayer insulating layer having a contact hole and an opening extending therethrough, the contact hole exposing a source area and a drain area of the semiconductor layer and the opening exposing a channel area of the semiconductor layer; and a source electrode and a drain electrode formed on the interlayer insulating layer, the source electrode being connected with the source area and the drain electrode being connected with the drain area of the semiconductor layer, a pixel electrode on the thin film transistor and connected with the thin film transistor, an organic light emitting member on the pixel electrode, and a common electrode on the organic light emitting member.

An edge of a channel area of the semiconductor layer may include boundary edge portions adjacent to the source area and the drain area and a connection edge portion connecting the boundary edge portions, and the opening may expose the gate insulating pattern on the connection edge portion of the channel area of the semiconductor layer.

The opening may further expose the buffer layer adjacent to the connection edge portion of the channel area of the semiconductor layer.

The opening may extend along the connection edge portion of the channel area.

A pattern of the gate insulating pattern may be the same as a pattern of the semiconductor layer.

The gate electrode may include a gate metal formed of any one selected from Sc, Ti, Zr, Hf, V, Nb, Ta, Cr, Mo, W, Mn, Re, Ru, Os, Co, Rh, Ir, Pt, Y, Ta, La, Ce, Pr, Nd, Dy, Ho, Al, ITO, an alloy thereof, and a metal silicide.

The gate electrode may further include a gate metal electrode contacting the gate insulating pattern and a low-resistive metal electrode on the gate metal electrode.

DETAILED DESCRIPTION

Figure 1:
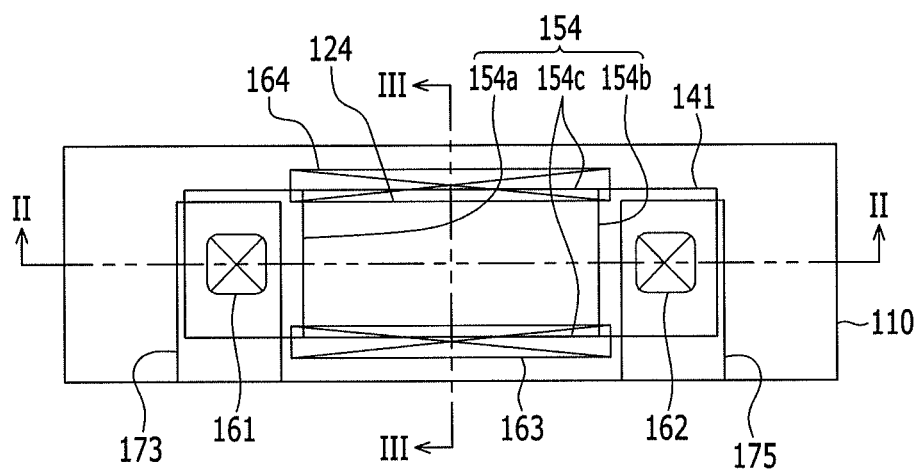
FIG. 1 illustrates a layout view of a thin film transistor according to a first exemplary embodiment.

In the following detailed description, only certain exemplary embodiments have been shown and described, simply by way of illustration. As those skilled in the art would realize, the described embodiments may be modified in various different ways, all without departing from the spirit or scope of the present invention.

Accordingly, the drawings and description are to be regarded as illustrative in nature and not restrictive. Like reference numerals designate like elements throughout the specification In addition, the size and thickness of each component shown in the drawings are arbitrarily shown for understanding and ease of description, but embodiments are not limited thereto.

A thin film transistor according to a first exemplary embodiment will now be described in further detail with reference to FIG. 1 to FIG. 3.

Figure 2:
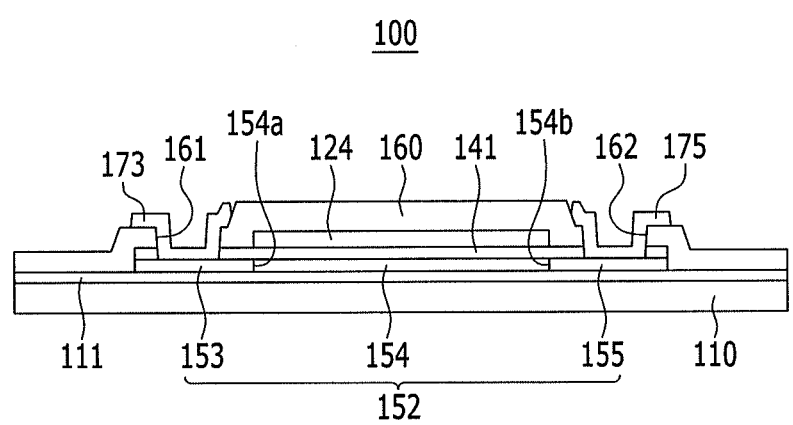
FIG. 2 illustrates a cross-sectional view of FIG. 1, taken along the line II-II.
Figure 3:
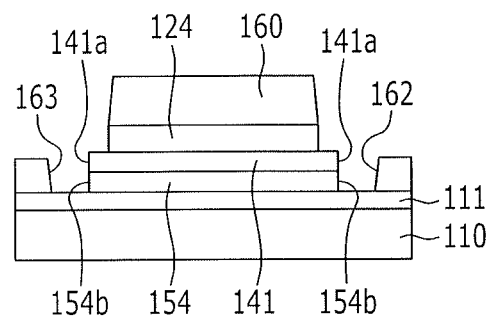
FIG. 3 illustrates a cross-sectional view of FIG. 1, taken along the line III-III.

FIG. 1 illustrates a layout view of a thin film transistor according to the first exemplary embodiment, FIG. 2 illustrates a cross-sectional view of FIG. 1, taken along the line II-II, and FIG. 3 illustrates a cross-sectional view of FIG. 1, taken along the line III-III.

As shown in FIG. 1 to FIG. 3, a thin film transistor 100 according to the first exemplary embodiment may include a substrate 110 made of transparent glass or plastic and a buffer layer 111 formed on the substrate 110. The buffer layer 111 may include silicon nitride (SiNx) or silicon oxide (SiOx), and may have a single-layered or multi-layered structure. The buffer layer 111 may prevent diffusion of moisture of impurities generated from the substrate 110 to a semiconductor layer 152, and/or may control heat transmission speed during crystallization of the semiconductor layer 152 for efficient crystallization of the semiconductor layer 152.

The semiconductor layer 152 may be formed on the buffer layer 111, and the semiconductor layer 152 may include polysilicon. The semiconductor layer 152 may include a source area 153, a drain area 155, and a channel area 154 disposed between the source area 153 and the drain area 155.

Edge portions 154a and 154b of the channel area 154 of the semiconductor layer 152 may include boundary edge portions 154a and 154b that are adjacent to the source area 153 and the drain area 155, respectively, and a connection edge portion 154c connecting the boundary edge portions 154a and 154b.

A gate insulating pattern 141 may be formed on the semiconductor layer 152. The gate insulating pattern 141 may include silicon nitride (SiNx) or silicon oxide (SiOx), and may be formed in a pattern that is the same as that of the semiconductor layer 152.

A gate electrode 124 may be formed on the gate insulating pattern 141. The gate electrode 124 may be connected to a gate line (not shown) that transmits a gate signal. The gate electrode 124 may include a gettering metal (gate metal) including Sc, Ti, Zr, Hf, V, Nb, Ta, Cr, Mo, W, Mn, Re, Ru, Os, Co, Rh, Ir, Pt, Y, Ta, La, Ce, Pr, Nd, Dy, Ho, Al, ITO, an alloy thereof, or a metal silicide. The gate electrode 124 formed of the gettering metal, may contact the semiconductor layer 152 followed by a gettering heat treatment to move residual metal catalysts in the semiconductor layer 152 to the gate electrode, to thereby prevent a leakage current.

An interlayer insulating layer 160 may be formed on the gate electrode 124, the gate insulating pattern 141, and the substrate 110. The interlayer insulating layer 160 may include contact holes 161 and 162, that partially expose the source area 153 and the drain area 155 of the semiconductor layer 152, and openings 163 and 164 that partially expose the channel area 154 of the semiconductor layer 152.

In further detail, the openings 163 and 164 may extend along the connection edge portion 154c of the channel area 154, and expose the connection edge portion 154c of the channel area 154 and the gate insulating pattern 141 on the connection edge portion 154b of the channel area 154. In addition, the openings 163 and 164 may expose the buffer layer 111 that is adjacent to the connection edge portion 154c of the channel area 154 of the semiconductor layer 152.

The source electrode 173 and the drain electrode 175 connected with the source area 153 and the drain area 155, respectively, of the semiconductor layer 152 are formed on the interlayer insulating layer 160. The source electrode 173 and the drain electrode 175 may be respectively connected with the source area 153 and the drain area 153 of the semiconductor layer 152 through the contact holes 161 and 162 of the interlayer insulating layer 160.

When the source electrode 173 and the drain electrode 175 are formed, an edge portion 124a (refer to FIG. 17) of the gate electrode 124 formed on the connection edge portion 154c of the channel area 154 of the semiconductor layer 152 may be simultaneously etched using the openings 163 and 164 of the interlayer insulating layer 160 such that residual metal catalysts in the edge portion 124a of the gate electrode 124 may be removed through a gettering heat treatment process. Thus, no additional process may be required for forming and eliminating the gettering metal layer. Accordingly, the manufacturing process may be minimized, thereby reducing production costs.

Hereinafter, a manufacturing method of the thin film transistor according to the first exemplary embodiment will be described with reference to FIG. 4 to FIG. 17.

Figure 4:
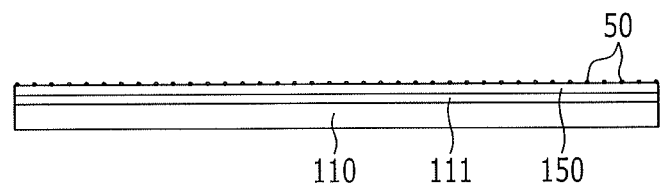
FIG. 4 and FIG. 5 sequentially illustrate stages in a manufacturing method of a thin film transistor according to the first exemplary embodiment, and stages in a process for forming a polysilicon layer and a gate insulating layer.
Figure 5:
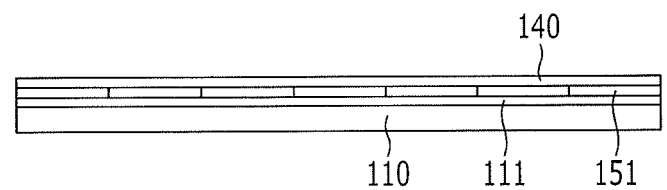
Figure 6:
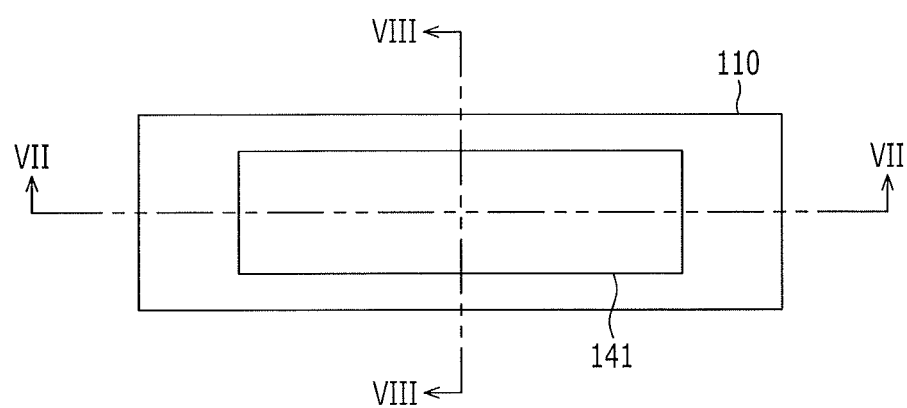
FIG. 6 illustrates a layout view of a thin film transistor of the next process of FIG. 5.
Figure 7:
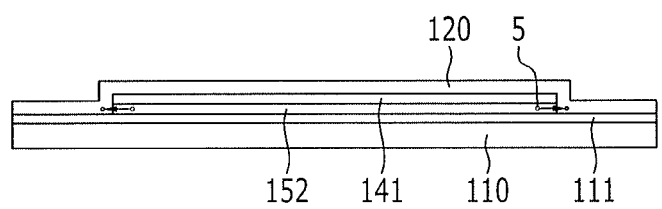
FIG. 7 illustrates a cross-sectional view of FIG. 6, taken along the line VII-VII.
Figure 8:
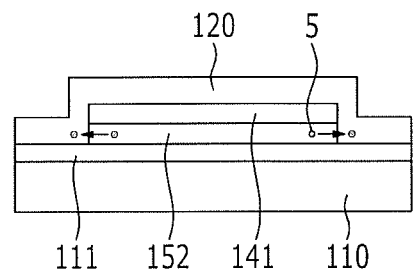
FIG. 8 illustrates a cross-sectional view of FIG. 7, taken along the line VIII-VIII.
Figure 9:
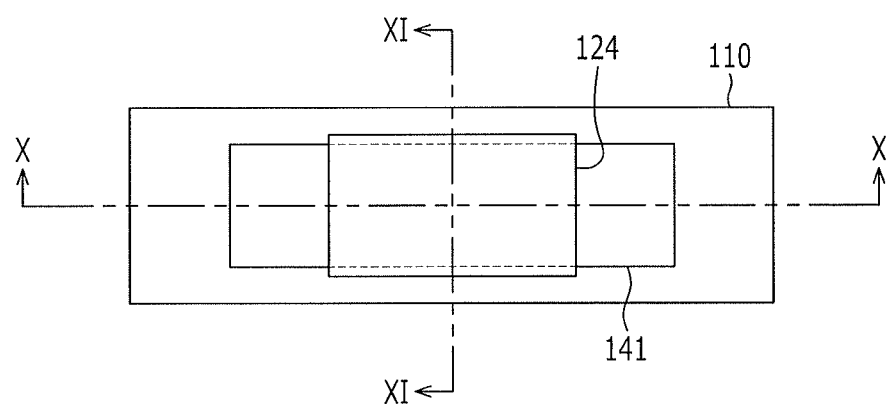
FIG. 9 illustrates a layout view of the thin film transistor of the next process of FIG. 6.
Figure 10:
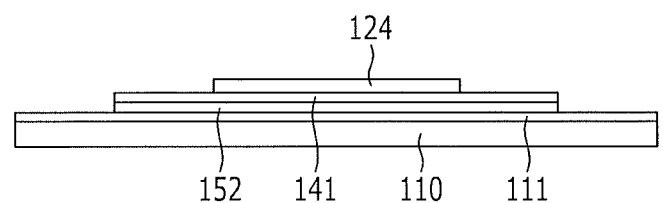
FIG. 10 illustrates a cross-sectional view of FIG. 9, taken along the line X-X.
Figure 11:
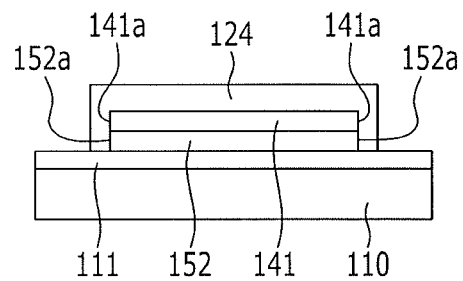
FIG. 11 illustrates a cross-sectional view of FIG. 9, taken along the line XI-XI.
Figure 12:
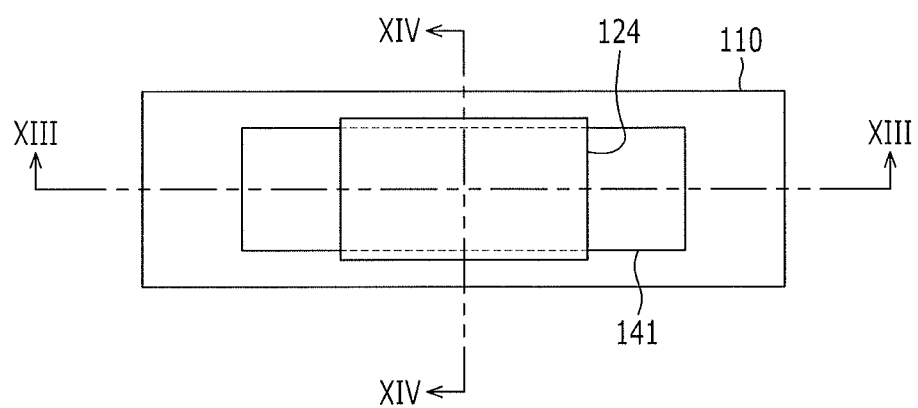
FIG. 12 illustrates a layout view of the thin film transistor of the next process of FIG. 9.
Figure 13:
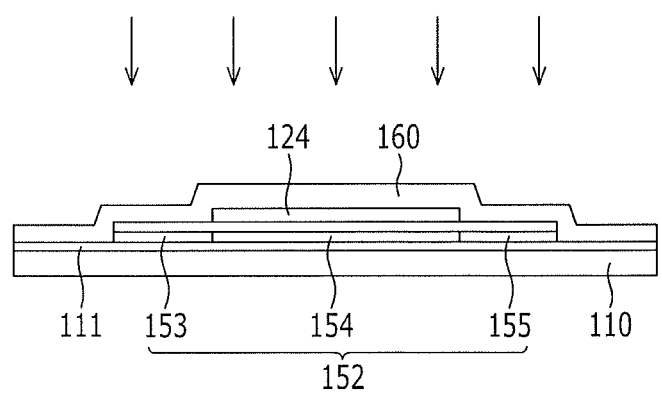
FIG. 13 illustrates a cross-sectional view of FIG. 12, taken along the line XIII-XIII.
Figure 14:
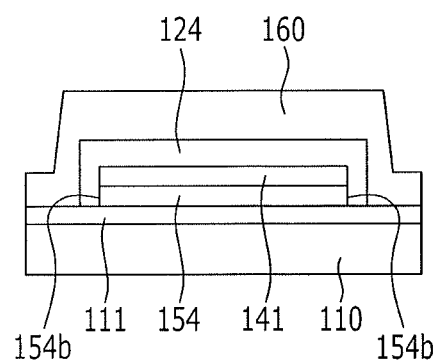
FIG. 14 illustrates a cross-sectional view of FIG. 12, taken along the line XIV-XIV.
Figure 15:
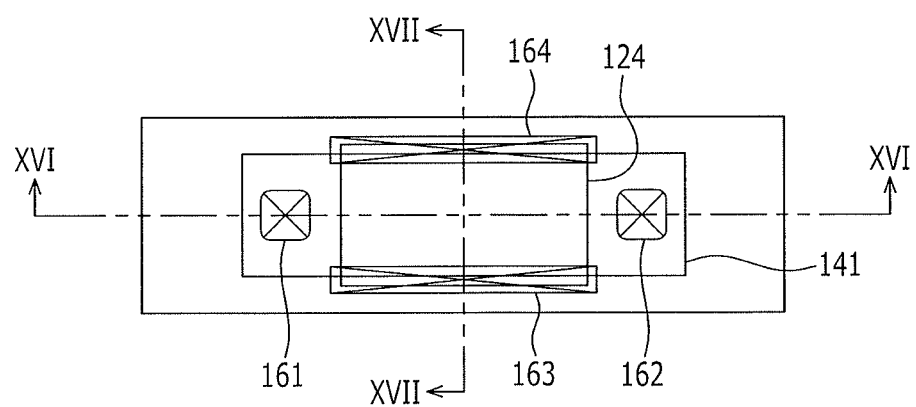
FIG. 15 illustrates a layout view of the thin film transistor of the next process of FIG. 12.
Figure 16:
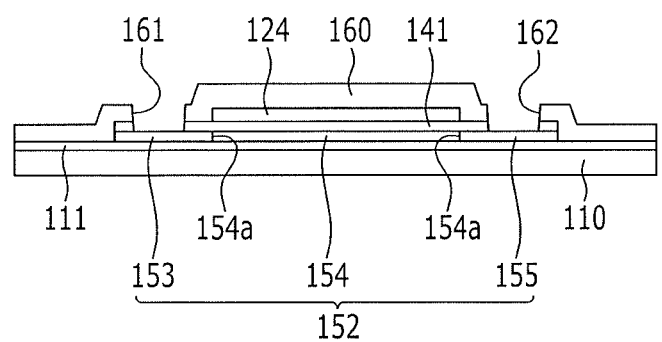
FIG. 16 illustrates a cross-sectional view of FIG. 15, taken along the line XVI-XVI.
Figure 17:
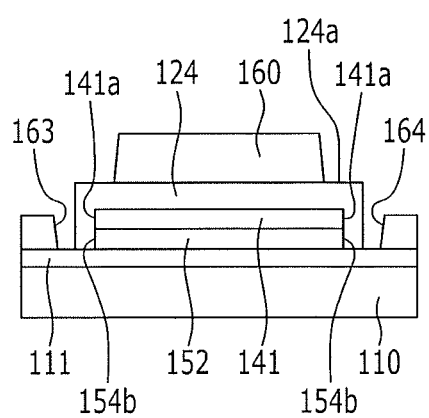
FIG. 17 illustrates a cross-sectional view of FIG. 15, taken along the line XVII-XVII.

FIG. 4 and FIG. 5 sequentially illustrate stages in a manufacturing method of a thin film transistor according to the first exemplary embodiment, and a process for forming a polysilicon layer and a gate insulating layer, FIG. 6 illustrates a layout view of a thin film transistor of the next process of FIG. 5, FIG. 7 illustrates a cross-sectional view of FIG. 6, taken along the line VII-VII, FIG. 8 illustrates a cross-sectional view of FIG. 7, taken along the line VIII-VIII, FIG. 9 illustrates a layout view of the thin film transistor of the next process of FIG. 6, FIG. 10 illustrates a cross-sectional view of FIG. 9, taken along the line X-X, FIG. 11 illustrates a cross-sectional view of FIG. 9, taken along the line XI-XI, FIG. 12 illustrates a layout view of the thin film transistor of the next process of FIG. 9, FIG. 13 illustrates a cross-sectional view of FIG. 12, taken along the line XIII-XIII, FIG. 14 illustrates a cross-sectional view of FIG. 12, taken along the line XIV-XIV, FIG. 15 illustrates a layout view of the thin film transistor of the next process of FIG. 12, FIG. 16 illustrates a cross-sectional view of FIG. 15, taken along the line XVI-XVI, and FIG. 17 illustrates a cross-sectional view of FIG. 15, taken along the line XVII-XVII.

First, as shown in FIG. 4, the buffer layer 111 may be formed on the substrate 110. The buffer layer 111 may be made of silicon nitride (SiNx) or silicon nitride (SiOx) using a chemical vapor deposition method or a physical vapor deposition method. In addition, an amorphous silicon layer 150 may be formed on the buffer layer 111. In this case, the amorphous silicon layer 150 may be formed using the chemical vapor deposition method or the physical vapor deposition method. Further, a metal catalyst layer 50 may be formed on the amorphous silicon layer 150. The metal catalyst layer 50 may include a metal catalyst selected from Ni, Pd, Ag, Au, Al, Sn, Sb, Cu, Tr, and Cd. According to an embodiment, the metal catalyst may include nickel (Ni).

Next, as shown in FIG. 5, the amorphous silicon layer 150 may be crystallized using the metal catalyst layer 50 to form a polysilicon layer 151. That is, the metal catalysts diffused to the amorphous silicon layer 150 may be controlled to be low (e.g., lowered) to crystallize the amorphous silicon layer 150 to the polysilicon layer 151, using an SGS method. According to the SGS method, the size of a crystal particle may be controlled to be several μm to several hundreds μm. In the present exemplary embodiment, the SGS method may be used, but a metal induced crystallization (MIC) method or a metal induced lateral crystallization (MILC) method may be used to crystallize the amorphous silicon layer 150 to the polysilicon layer 151. The MIC method may include crystallizing the amorphous silicon layer 150 into the polysilicon layer 151 through a phase change by a metal catalyst, which comes in contact with or is injected into the amorphous silicon layer 150. The MILC method may be a method of crystallizing the amorphous silicon layer 150 in which silicide created by the reaction of metal and the amorphous silicon layer 150 may be propagated continuously and laterally to induce the sequential crystallization of the amorphous silicon layer 150.

Then, the gate insulating layer 140 may be formed on the polysilicon layer 151.

Next, as shown in FIG. 6 to FIG. 8, the polysilicon layer 151 and the gate insulating layer 140 may be formed into the semiconductor layer 152 and the gate insulating pattern 141, respectively, by simultaneously patterning the polysilicon layer 151 and the gate insulating layer 140. Thus, the gate insulating pattern 141 and the semiconductor layer 152 may have the same pattern.

In addition, a gate metal layer 120 that covers the gate insulating pattern 141 and the substrate 110 may be formed. The gate metal layer 120 may include one of Sc, Ti, Zr, Hf, V, Nb, Ta, Cr, Mo, W, Mn, Re, Ru, Os, Co, Rh, Ir, Pt, Y, Ta, La, Ce, Pr, Nd, Dy, Ho, Al, ITO, an alloy thereof, or a metal silicide. In this case, the gate metal layer 120 may contact a side of the semiconductor layer 152.

In addition, the residual metal catalysts 5 in the semiconductor layer 152 may be moved to the gate metal layer 120 that contacts the semiconductor layer 152 through gettering heat treatment. In this case, the gettering heat treatment may be performed at a temperature between 450° C. and 1043° C. When the gettering heat treatment is performed at a temperature lower than 450° C., the residual metal catalysts 5 in the semiconductor layer 152 may not easily move to the gate metal layer 120. When the gettering heat treatment is performed at a temperature higher than 1043° C., the substrate 110 may be deformed. In this case, a surface density of the residual metal catalysts 5 in the channel area 154 of the semiconductor layer 152 is $10^{13}$ to $10^{15}$ atoms/cm$^2$ before performing the gettering heat treatment, but the surface density can be maintained lower than $10^{13}$ atoms/cm$^2$ after performing the gettering heat treatment.

Thus, the amount of residual metal catalysts 5 may be minimized in the semiconductor layer 152 so that a leakage current may be reduced.

In the above description, the gettering heat treatment may be performed after the gate metal layer 120 is formed, but the gettering heat treatment may be performed until the source electrode 173 and the drain electrode 175 are formed. For example, the gettering heat treatment may be formed after the gate electrode 124 is formed, after the source area 153 and the drain area 155 are formed in the semiconductor layer 152, after the interlayer insulating layer 160 is formed, and after the openings 163 and 164 are formed in the interlayer insulating layer 160.

As described, the gettering heat treatment process may be performed using the gate metal layer 120 that forms the gate electrode 124 rather than using an additional gettering metal layer so that the manufacturing process may be minimized, and accordingly production cost may be reduced.

Meanwhile, an operation speed of the thin film transistor may be improved by forming a low-resistive metal layer including Al, Cu, Ag, and the like on the gate metal layer 120.

Next, as shown in FIG. 9 to FIG. 11, the gate electrode 124 may be formed by patterning the gate metal layer 120. The gate electrode 124 is formed at a location corresponding to the channel area 154 of the semiconductor layer 152, and may cover an edge portion 141*a* of the gate insulating pattern 141 and an edge portion 152*a* of the semiconductor layer 152.

Next, as shown in FIG. 12 to FIG. 14, the semiconductor layer 152 may be doped using the gate electrode 124 as a doping mask to form the source area 153 and the drain area 155 of the semiconductor layer 152. In this case, a not-doped or undoped channel area 154 may be formed between the source area 153 and the drain area 155. In addition, the interlayer insulating layer 160 covering the gate electrode 124, the gate insulating pattern 141, and the substrate 110 may be formed. The interlayer insulating layer 160 may be made of silicon nitride (SiNx) or silicon oxide (SiOx) using a chemical vapor deposition method or a physical vapor deposition method.

Next, as shown in FIG. 15 to FIG. 17, the interlayer insulating layer 160 and the gate insulating pattern 141 may be patterned to form the contact holes 161 and 162 exposing the source area 153 and the drain area 155 of the semiconductor layer 152 and the openings 163 and 164 exposing the edge portion 124*a* of the gate electrode 124 on the channel area 154 of the semiconductor layer 152. The openings 163 and 164 may expose the connection edge portion 154*c* of the channel area 154 of the semiconductor layer 152 and a buffer layer 111 that is adjacent to the connection edge portion 154*c*.

Next, as shown in FIG. 1 to FIG. 3, the source electrode 173 and the drain electrode 175 that are respectively connected with the source area 153 and the drain area 155 of the semiconductor layer 153 on the interlayer insulating layer 160 may be formed. In this case, the edge portion 124*a* of the gate electrode 124, exposed through the openings 163 and 164 may be wet-etched to expose the edge portion 141*a* of the gate insulating pattern 141 on the connection edge portion 154*c* of the channel area 154 of the semiconductor layer 152.

As described, the edge portion 124*a* of the gate electrode 124, which contains the residual metal catalysts 5, through contact with the semiconductor layer 152, may be etched simultaneously when the source electrode 173 and the drain electrode 175 are formed so as to eliminate the residual metal catalysts 5. Accordingly, the leakage current may be effectively reduced.

In the manufacturing method of the thin film transistor according to the first exemplary embodiment, the metal catalyst layer 50 may be formed on the amorphous silicon layer 150 and the polysilicon layer 151 may be formed by crystallizing the amorphous silicon layer 150. According to some embodiments, the metal catalyst layer 50 and the amorphous silicon layer 150 may be formed on the buffer layer 111 and the polysilicon layer 151 may be formed by crystallizing the amorphous silicon layer 150.

Figure 18:
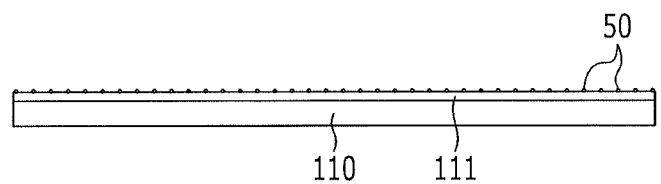
FIG. 18 and FIG. 19 illustrate stages in another manufacturing method of the thin film transistor according to the first exemplary embodiment, and a process for forming a polysilicon layer and a gate insulating layer.
Figure 19:
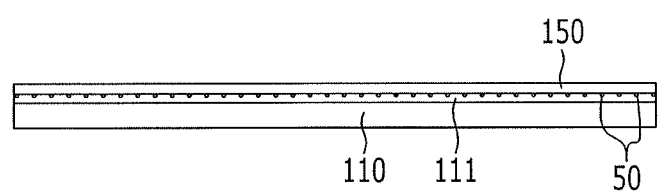

FIG. 18 and FIG. 19 sequentially illustrate stages in another manufacturing method of the thin film transistor according to the first exemplary embodiment, and a process for forming the polysilicon layer 151 and the gate insulating layer 140 are illustrated in the drawings.

As shown in FIG. 18, the buffer layer 111 may be formed on the substrate 110 and the metal catalyst layer 50 may be formed on the buffer layer 111. In addition, a diffusion heat treatment process may be performed for interaction and diffusion of the metal catalyst layer 50 and the buffer layer 111, so that elimination of the metal catalyst layer 50 due to a cleansing process may be prevented.

Next, as shown in FIG. 19, the amorphous silicon layer 15 may be formed on the metal catalyst layer 50.

Then, as shown in FIG. 5, the polysilicon layer 151 may be formed by crystallizing the amorphous silicon layer 150 using the metal catalyst layer 50, and the gate insulating layer may be formed on the polysilicon layer 151.

In this case, an impurity may be prevented from being formed between the amorphous silicon layer and the gate insulating layer.

Meanwhile, in the manufacturing method of the thin film transistor according to the first exemplary embodiment, the metal catalyst layer 50 may be formed on the amorphous silicon layer 150 and the polysilicon layer 151 may be formed by crystallizing the amorphous silicon layer 150. According to some embodiments, the metal catalyst layer 50, the amorphous silicon layer 150, and the gate insulating layer 14 may be sequentially formed on the buffer layer 111 and then the polysilicon layer 151 may be formed by crystallizing the amorphous silicon layer 150.

Figure 20:
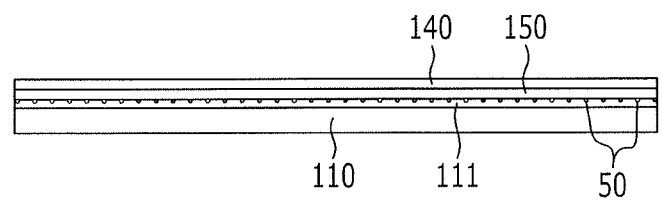
FIG. 20 illustrate stages in another manufacturing method of the thin film transistor according to the first exemplary embodiment, and stages in a process for forming a polysilicon layer and a gate insulating layer.

FIG. 20 illustrate stages in another manufacturing method of the thin film transistor according to the first exemplary embodiment, and illustrates a process for forming the polysilicon layer and the gate insulating layer.

As shown in FIG. 20, the buffer layer 111 may be formed on the substrate 110 and the metal catalyst layer 50 may be formed on the buffer layer 111. In addition, the amorphous silicon layer 150 may be formed on the metal catalyst layer 50, and the gate insulating layer 140 may be formed on the amorphous silicon layer 150.

Next, as shown in FIG. 5, the polysilicon layer 151 may be formed by crystallizing the amorphous silicon layer 150 using the metal catalyst layer 50.

In this case, the amorphous silicon layer 150 and the gate insulating layer 140 may be continuously formed. Therefore, an impurity may be prevented from being formed between the amorphous silicon layer 150 and the gate insulating layer 140.

The thin film transistor, according to the first exemplary embodiment, may be applied to a switching thin film transistor Qs and a driving thin film transistor Qd of an OLED display.

Figure 21:
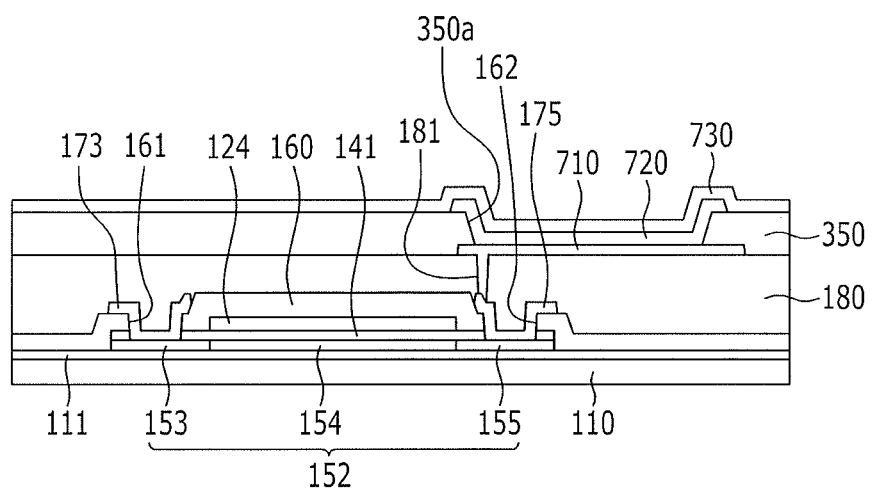
FIG. 21 illustrates a cross-sectional view of an OLED display including the thin film transistor according to the first exemplary embodiment.

FIG. 21 illustrates a cross-sectional view of an OLED display including the thin film transistor according to the first exemplary embodiment.

As shown in FIG. 21, a protective layer 180 may be formed on the thin film transistor 100. The protective layer 180 may include any inorganic layer selected from silicon nitride (SiNx), silicon oxide (SiOx), or SOG or any organic layer selected from polyimide, benzocyclobutene-series resin, or acrylate. In addition, the protective layer 190 may have a layered structure including an inorganic layer and an organic layer.

A pixel electrode 710 may be formed on the protective layer 180. The pixel electrode 710 may be connected with a drain electrode 175 through a via hole 181 formed in the protective layer 180. The pixel electrode 710 may include a reflective electrode having high reflectivity, or the pixel electrode 710 may include a transparent material such as indium tin oxide (ITO) or indium zinc oxide (IZO). The reflective electrode may include a reflective material, such as lithium (Li), calcium (Ca), fluoride lithium/calcium (LiF/Ca), fluoride lithium/aluminum (LiF/Al), aluminum (Al), silver (Ag), magnesium (Mg), and gold (Au).

A barrier rib 350 may be formed on the pixel electrode 710. The barrier rib 350 may define a barrier rib opening 350a exposing most of the pixel electrode 710 by surrounding the periphery of the edge of the pixel electrode 710.

An organic light emitting member 720 may be formed on the barrier rib opening 350a and the pixel electrode 710. The organic light emitting member 720 may include an auxiliary layer (not shown) for enhancing light emission efficiency of the light emission layer, in addition to the organic emission layer that emits light. The auxiliary layer may include one or more selected from an electron transport layer (ETL), a hole transport layer (HTL), an electron injection layer (EIL), and a hole injection layer (HIL).

A common electrode 730 may be formed on the organic light emitting member 720. The common electrode 730 may include a transparent material such as ITO or IZO. The common electrode 270 may be formed over the entire surface of the substrate 110 and allow a current to flow to the organic light emitting member 720 as a pair with the pixel electrode 710.

An encapsulation member (not shown) that encapsulates the common electrode 730 by covering the same may be formed on the common electrode 730.

Generation of heat due to resistance may be prevented and operation speed of the thin film transistor may be improved by forming a gate electrode 124 in a double-layered structure of a gate metal electrode and a low-resistive metal electrode.

Hereinafter, a thin film transistor, according to a second exemplary embodiment will be described with reference to FIG. 22.

Figure 22:
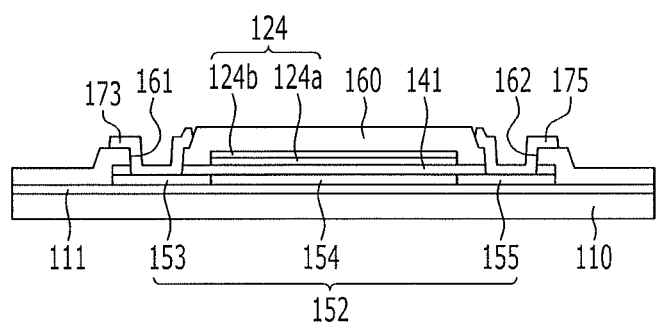
FIG. 22 illustrates a cross-sectional view of a thin film transistor according to a second exemplary embodiment.

FIG. 22 illustrates a cross-sectional view of a thin film transistor according to the second exemplary embodiment.

The second exemplary embodiment may be substantially the same as the first exemplary embodiment shown in FIG. 1 to FIG. 3, except that a gate electrode may be formed by double-layering a gate metal electrode and a low-resistive metal electrode. Therefore, a description of similar portions or features will be omitted.

As shown in FIG. 22, a gate electrode 124 may be formed on a gate insulating pattern 141, and the gate electrode 124 may be connected to a gate line (not shown) that transmits a gate signal. The gate electrode 124 may include a gate metal electrode 124a contacting a gate insulating pattern 141 and a low-resistive metal electrode 124b formed on the gate metal electrode 124a. The gate metal electrode 124a may include a gate metal (gettering metal) selected from Sc, Ti, Zr, Hf, V, Nb, Ta, Cr, Mo, W, Mn, Re, Ru, Os, Co, Rh, Ir, Pt, Y, Ta, La, Ce, Pr, Nd, Dy, Ho, Al, ITO, an alloy thereof, or a metal silicide. The gate metal electrode 124a of the gate electrode 124 may facilitate the gate metal electrode 124a to contact a semiconductor layer 152 and perform a gettering heat treatment to make a residual metal catalyst remaining in the semiconductor layer 152 move to the gate metal electrode 124a of the gate electrode 124, thereby preventing a leakage current.

The low-resistive metal electrode 124b may include Al, Cu, Ag, and the like, and may prevent heat generation due to resistance and improve operation speed of the thin film transistor.

One or more embodiments may provide a thin film transistor that may reduce a leakage current and reduce manufacturing costs by simplifying a manufacturing process, a manufacturing method thereof, and an organic light emitting diode (OLED) display including the same. According to the exemplary embodiments, a gettering heat treatment may be performed using a gate electrode including a gettering metal so that an additional process for forming and removing a gettering metal layer may be eliminated, thereby minimizing manufacturing process and reducing manufacturing cost. In addition, an edge portion of the gate electrode that includes residual metal catalysts, may be simultaneously etched when formed. Source and drain electrodes may be formed by contacting a semiconductor layer to remove the residual metal catalyst, thereby effectively reducing a leakage current.

Further, a leakage current of the semiconductor layer is effectively reduced to solve problems of increase of black luminance, an image stain, and an image failure.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor, comprising:
    a substrate;
    a buffer layer on the substrate;
    a semiconductor layer on the buffer layer;
    a gate insulating pattern on the semiconductor layer;
    a gate electrode on the gate insulating pattern;
    an interlayer insulating layer covering the gate electrode and the gate insulating pattern, the interlayer insulating layer having a contact hole and an opening extending therethrough, the contact hole exposing a source area and a drain area of the semiconductor layer, and the opening exposing an undoped channel area of the semiconductor layer; and
    a source electrode and a drain electrode on the interlayer insulating layer, the source electrode being connected with the source area and the drain electrode being connected with the drain area of the semiconductor layer.

2. The thin film transistor of claim 1, wherein an edge portion of the channel area of the semiconductor layer includes boundary edge portions adjacent to the source and drain areas and a connection edge portion connecting the boundary edge portions, and the opening exposes the gate insulating pattern on the connection edge portion of the channel area of the semiconductor layer.

3. The thin film transistor of claim 2, wherein the opening further exposes the buffer layer adjacent to the connection edge portion of the channel area of the semiconductor layer.

4. The thin film transistor of claim 2, wherein the opening extends along the connection edge portion of the channel area.

5. The thin film transistor of claim 1, wherein a pattern of the gate insulating pattern is the same as a pattern of the semiconductor layer.

6. The thin film transistor of claim 1, wherein the gate electrode includes a gate metal made of any one selected from Sc, Ti, Zr, Hf, V, Nb, Ta, Cr, Mo, W, Mn, Re, Ru, Os, Co, Rh, Ir, Pt, Y, Ta, La, Ce, Pr, Nd, Dy, Ho, Al, ITO, an alloy thereof, and a metal silicide.

7. The thin film transistor of claim 6, wherein the gate electrode further includes a gate metal electrode contacting the gate insulating pattern and a low-resistive metal electrode formed on the gate metal electrode.

8. A manufacturing method of a thin film transistor, the method comprising:
    forming a buffer layer on a substrate;
    forming a semiconductor layer on the buffer layer;
    forming a gate insulating pattern on the semiconductor layer;
    forming a gate metal layer covering the gate insulating pattern and the substrate;
    moving residual metal catalysts in the semiconductor layer to the gate metal layer that contacts the semiconductor layer by performing gettering heat treatment on the semiconductor layer;
    forming a gate electrode by patterning the gate metal layer;
    forming an interlayer insulating layer covering the gate electrode, the gate insulating pattern, and the substrate;
    forming a contact hole exposing a source area and a drain area of the semiconductor layer and an opening exposing the gate electrode on an undoped channel area of the semiconductor layer by patterning the interlayer insulating layer and the gate insulating pattern;
    and forming a source electrode connected with the source area and a drain electrode connected with the drain area of the semiconductor layer on the interlayer insulating layer.

9. The manufacturing method of the thin film transistor of claim 8, wherein, forming of the source electrode and the drain electrode includes:
    exposing the gate insulating pattern on a connection edge portion of the channel area of the semiconductor by etching an edge portion of the gate electrode exposed through the opening.

10. The manufacturing method of the thin film transistor of claim 9, wherein the opening exposes the buffer layer adjacent to the connection edge portion of the channel area of the semiconductor layer.

11. The manufacturing method of the thin film transistor of claim 8, wherein forming the source area and the drain area in the semiconductor layer includes doping the semiconductor layer using the gate electrode as a doping mask.

12. The manufacturing method of the thin film transistor of claim 8, wherein a pattern of the gate insulating pattern is the same as a pattern of the semiconductor layer.

13. The manufacturing method of the thin film transistor of claim 8, wherein the gate metal layer contacts a side of the semiconductor layer.

14. The manufacturing method of the thin film transistor of claim 8, wherein, the gate electrode is formed on a channel area of the semiconductor layer and covers an edge portion of the gate insulating pattern.

15. The manufacturing method of the thin film transistor of claim 8, wherein forming of the semiconductor layer and the gate insulating pattern includes:
    sequentially forming an amorphous silicon layer and a metal catalyst layer on the buffer layer;
    forming a polysilicon layer by crystallizing the amorphous silicon layer;
    forming a gate insulating layer on the polysilicon layer; and
    simultaneously patterning the polysilicon layer and the gate insulating layer.

16. The manufacturing method of the thin film transistor of claim 8, wherein the forming of the semiconductor layer and the gate insulating pattern includes:
    forming a metal catalyst layer and an amorphous silicon layer on the buffer layer;
    forming a polysilicon layer by crystallizing the amorphous silicon layer;
    forming a gate insulating layer on the polysilicon layer; and
    simultaneously patterning the polyslilicon layer and the gate insulating layer.

17. The manufacturing method of the thin film transistor of claim 8, wherein forming of the semiconductor layer and the gate insulating pattern includes:

sequentially forming a metal catalyst layer, an amorphous silicon layer, and a gate insulating layer on the buffer layer;

forming a polysilicon layer by crystallizing the amorphous silicon layer; and simultaneously patterning the polysilicon layer and the gate insulating layer.

18. The manufacturing method of the thin film transistor of claim 8, wherein the gettering heat treatment is performed at a temperature between 450° C. and 1043° C.

19. The manufacturing method of the thin film transistor of claim 8, further comprising forming a low-resistive metal layer on the gate metal layer.

20. The manufacturing method of the thin film transistor of claim 19, wherein forming the gate electrode includes patterning the gate metal layer and the low-resistive metal layer.

21. An organic light emitting diode (OLED) display comprising:
  a thin film transistor including:
    a substrate,
    a buffer layer on the substrate,
    a semiconductor layer on the buffer layer,
    a gate insulating pattern on the semiconductor layer,
    a gate electrode on the gate insulating pattern,
    an interlayer insulating layer covering the gate electrode and the gate insulating pattern, the interlayer insulating layer having a contact hole and an opening extending therethrough, the contact hole exposing a source area and a drain area of the semiconductor layer, and the opening exposing an undoped channel area of the semiconductor layer, and
    a source electrode and a drain electrode on the interlayer insulating layer, the source electrode being connected with the source area and the drain electrode being connected with the drain area of the semiconductor layer;
  a pixel electrode on the thin film transistor and connected with the thin film transistor;
  an organic light emitting member on the pixel electrode; and
  a common electrode on the organic light emitting member.

22. The OLED display of claim 21, wherein an edge of a channel area of the semiconductor layer include boundary edge portions adjacent to the source area and the drain area and a connection edge portion connecting the boundary edge portions, and the opening exposes the gate insulating pattern on the connection edge portion of the channel area of the semiconductor layer.

23. The OLED display of claim 22, wherein the opening further exposes the buffer layer adjacent to the connection edge portion of the channel area of the semiconductor layer.

24. The OLED display of claim 22, wherein the opening extends along the connection edge portion of the channel area.

25. The OLED display of claim 21, wherein a pattern of the gate insulating pattern is the same as a pattern of the semiconductor layer.

26. The OLED display of claim 21, wherein the gate electrode includes a gate metal including any one selected from Sc, Ti, Zr, Hf, V, Nb, Ta, Cr, Mo, W, Mn, Re, Ru, Os, Co, Rh, Ir, Pt, Y, Ta, La, Ce, Pr, Nd, Dy, Ho, Al, ITO, an alloy thereof, and a metal silicide.

27. The OLED display of claim 26, wherein the gate electrode further includes a gate metal electrode contacting the gate insulating pattern and a low-resistive metal electrode on the gate metal electrode.

* * * * *